(12) United States Patent
Janssens et al.

(10) Patent No.: US 12,227,446 B2
(45) Date of Patent: Feb. 18, 2025

(54) METHOD OF FABRICATING A THROUGH GLASS VIA ON A SUSPENDED NANOCRYSTALLINE DIAMOND

(71) Applicant: OKINAWA INSTITUTE OF SCIENCE AND TECHNOLOGY SCHOOL CORPORATION, Okinawa (JP)

(72) Inventors: Stoffel Dominique Janssens, Okinawa (JP); David Vazquez-Cortes, Okinawa (JP); Alessandro Giussani, Okinawa (JP); Eliot Martin Fried, Okinawa (JP)

(73) Assignee: OKINAWA INSTITUTE OF SCIENCE AND TECHNOLOGY SCHOOL CORPORATION, Okinawa (JP)

( * ) Notice: Subject to any disclaimer, the term of this patent is extended or adjusted under 35 U.S.C. 154(b) by 650 days.

(21) Appl. No.: 17/606,380

(22) PCT Filed: Apr. 14, 2020

(86) PCT No.: PCT/JP2020/016402
§ 371 (c)(1),
(2) Date: Oct. 25, 2021

(87) PCT Pub. No.: WO2020/222297
PCT Pub. Date: Nov. 5, 2020

(65) Prior Publication Data
US 2022/0212982 A1 Jul. 7, 2022

Related U.S. Application Data

(60) Provisional application No. 62/839,768, filed on Apr. 28, 2019.

(51) Int. Cl.
*C03C 17/22* (2006.01)
*C03C 15/00* (2006.01)
(Continued)

(52) U.S. Cl.
CPC .............. *C03C 17/22* (2013.01); *C03C 15/00* (2013.01); *C03C 23/0025* (2013.01)

(58) Field of Classification Search
CPC ....... C03C 15/00; C03C 23/0025; C03C 17/22
See application file for complete search history.

(56) References Cited

U.S. PATENT DOCUMENTS

| 5,897,924 A | 4/1999 | Ulczynski et al. |
| 2005/0103758 A1 | 5/2005 | Otis et al. |

(Continued)

FOREIGN PATENT DOCUMENTS

| JP | 64-024049 A | 1/1989 |
| JP | 2012166999 A * | 9/2012 |

(Continued)

OTHER PUBLICATIONS

Abdou et al. "Air-clad suspended nanoncrystalline diamond ridge waveguides," Optics Express, vol. 26, No. 11 pp. 13883-13890 (May 28, 2018). (Year: 2018).*

(Continued)

*Primary Examiner* — Erin Snelting
(74) *Attorney, Agent, or Firm* — Rimon P.C.

(57) ABSTRACT

Low-cost and robust platforms are key for the development of next-generation 3D micro- and nanodevices. To fabricate such platforms, nanocrystalline diamond (NCD) is a highly appealing material due to its biocompatibility, robustness, and mechanical, electrical, electrochemical, and optical properties, while glass substrates with through vias are ideal interposers for 3D integration due to the excellent properties of glass. A low-cost process—free of photolithography and transfer printing—for fabricating arrays of TGVs that are sealed with suspended portions of an ultra-thin NCD film on one side is presented. These highly transparent structures may serve as a platform for the development of microwells (Continued)

for single-cell culture and analysis, 3D integrated devices such as microelectrodes, and quantum technologies. It is also possible to replace the NCD with silicon nitride or silicon carbide, allowing for the development of complex heterogeneous structures on a small scale.

14 Claims, 17 Drawing Sheets

(51) Int. Cl.
    *C03C 23/00*     (2006.01)
    *C03C 25/6208*     (2018.01)

(56) References Cited

U.S. PATENT DOCUMENTS

| | | |
|---|---|---|
| 2006/0292826 A1 | 12/2006 | Kajiyama et al. |
| 2015/0060402 A1 | 3/2015 | Burkett et al. |
| 2017/0295652 A1 | 10/2017 | Isobe |
| 2018/0037489 A1 | 2/2018 | Ono |
| 2018/0068868 A1 | 3/2018 | Jaramillo et al. |
| 2018/0339936 A1 | 11/2018 | Ono et al. |
| 2018/0340262 A1 | 11/2018 | Hiranuma |
| 2020/0156990 A1 | 5/2020 | Sakade et al. |

FOREIGN PATENT DOCUMENTS

| | | |
|---|---|---|
| JP | 2018-140892 A | 9/2018 |
| WO | 2019/044757 A1 | 3/2019 |

OTHER PUBLICATIONS

JP 2012-166999 A (Kitaoka) Sep. 6, 2012 (English language machine translation). [online] [retrieved Jun. 4, 2024]. Retrieved from: Espacenet. (Year: 2012).*

Written Opinion of the Internaitonal Searching Aithority issued in corresponding International Patent Application No. PCT/JP2020/016402, dated Jun. 30, 2020.

International Search Report issued in corresponding International Patent Application No. PCT/JP2020/016402, dated Jun. 30, 2020.

Janssens Stoffel D et al., "Nanocrystalline diamond-glass platform for the development of three-dimensional micro- and nanodevices", Diamond and Related Materialas, Elsevier Science Publishers, Amsterdam, NL, vol. 98, Aug. 10, 2019.

Extended European Search Report issue in corresponding European Patent Application No. 20799073.0-1108, dated May 18, 2022.

* cited by examiner

METHOD OF FABRICATING A THROUGH GLASS VIA ON A SUSPENDED NANOCRYSTALLINE DIAMOND

CROSS REFERENCE TO RELATED APPLICATIONS

This application is the U.S. National Phase under 35 U.S.C. § 371 of International Patent Application No. PCT/JP2020/016402, filed on Apr. 14, 2020, which claims the benefits of U.S. Provisional Application No. 62/839,768, filed on Apr. 28, 2019 the entire contents of which are hereby incorporated by reference.

TECHNICAL FIELD

This invention is concerning a method of fabricating a through glass via on a suspended nanocrystalline diamond.

BACKGROUND ART

Nanocrystalline diamond (NCD) is a highly appealing material for a variety of applications due to its biocompatibility, robustness, and mechanical, electrical, electrochemical, and optical properties. At odds with the general misconception that diamond is expensive, diamond films can be grown at low cost with microwave plasma assisted chemical vapor deposition. For NCD, this can be done on large area substrates using an inexpensive precursor mixture, consisting usually of methane gas diluted in molecular hydrogen, after the deposition of diamond seeds of diameter below 10 nm.

During growth, a boron-containing precursor can also be added to make p-type diamond that exhibits metallic properties when heavily doped. Boron-doped NCD can have a relatively wide potential window which, in combination with the chemical inertness and biocompatibility of diamond, makes it an attractive material for electrodes. During growth, dopants such as nitrogen and silicon can also be incorporated in diamond to form color centers for quantum technologies. After growth, NCD films can be processed to form two or three-dimensional suspended structures and the surface of an NCD film can be functionalized with a variety of (bio)molecules for use in biosensors and solar cells.

Due to these excellent properties, devices such as micromechanical resonators of high Q-factor, pressure sensors for harsh environments, tunable optical lenses, biosensors that, for example, can detect influenza, optically transparent electrodes, $CO_2$ reducing electrodes, superconducting quantum interference devices, and conducting atomic force microscope tips can be NCD-based.

For the fabrication of 3D structures in microdevices, interposing glass layers with through holes that serve as conduits for fluids or electrical connections to thin films are very useful. In recent years, these interposing layers have been made available by several companies in the form of thin glass substrates with Through Glass Vias (TGVs). Being inexpensive, transparent, electrically insulating, chemically inert, biocompatible, of high mechanical stiffness, and reusable, glass is a natural choice for the fabrication of interposing layers. For example, it was recently shown that the use of TGVs can lead to low-loss and high-linearity radio frequency interposers. Moreover, the properties of glass are strongly tunable. It can, for example, be made with coefficients of thermal expansion similar to those of semiconductor materials such as silicon and can thus be used to fabricate microdevices with minimal residual stress.

One of numerous viable processes for fabricating TGVs is based on wet etching and either laser ablation or the modification of glass with laser light, while AGC relies on a process that is based on a focused electrical discharging method. Laser ablation can be used for the fabrication of TGVs in polymer-laminated thin glass substrates. The polymer acts as a support for the thin glass plate.

SUMMARY OF INVENTION

Technical Problem

However, existing methods for achieving TGVs tend to rely on photolithography and transfer printing. If possible, it would be preferable to avoid photolithography and transfer printing.

Solution to Problem

The embodiments herein present a low-cost and robust nanocrystalline diamond-glass platform for single-cell culture and analysis, on-demand drug delivery systems, the modeling of vascular systems, microelectrodes, quantum technologies, and high-temperature MEMS. The embodiments herein comprise system and method for fabricating a glass substrate with through glass vias (TGVs) that are sealed on one side with suspended portions of an ultra-thin nanocrystalline diamond (NCD) film. The fabrication method is free of photolithography and transfer printing and is delineated in detail sufficient to allow easy replication by others. In this process, hydrofluoric acid (HF) is used to first etch one side of a $10 \times 10 \times 0.2$ mm$^3$ Lotus NXT glass substrate to a thickness of approximately 50 µm. On the same side that is etched, blind holes of approximate diameter 40 µm and approximate depth 40 µm are subsequently formed by laser ablation. After growing an NCD film of approximate thickness 175 nm on the surface opposite to the etched side, the etched side of the substrate is further etched by HF to approximately 25 µm to produce the NCD sealed TGVs. The resulting platform is highly transparent and can handle applied pressures of at least 300 kPa.

BRIEF DESCRIPTION OF DRAWINGS

The disclosure contains at least one drawing in the format of a black and white photograph. This was done because such a format was the only practicable medium for illustrating the claimed invention.

DESCRIPTION OF EMBODIMENTS

The embodiments herein are directed toward development of devices that rely on the exceptional properties of glass and NCD, but do so using a low-cost system and method, free of photolithography and transfer printing. This system and method involves fabricating arrays of TGVs that are sealed on one side with suspended portions of an ultra-thin NCD film. The resulting platform can be useful for single-cell culture and analysis when the NCD film is made porous, which can be achieved through annealing, and thus, be used for nutrient or drug delivery.

From work on fabrication of robust membranes, it is also clear the systems and methods described herein have a future in the field of modeling vascular systems. When made with boron-doped NCD films, the system and methods described herein can be used to construct electrodes for microfluidic channels.

Alternatively, if comprising NCD with properly arranged lattice defects, the system and methods described herein can also be used for quantum technologies. It is also noteworthy that NCD can be replaced by other materials that are resistant to hydrofluoric acid (HF), such as silicon carbide or silicon nitride, and that their thermal properties, along with those of the glass used, allow for the fabrication of MEMS that can operate in air up to temperatures of about 400° C.

Figure 1A:
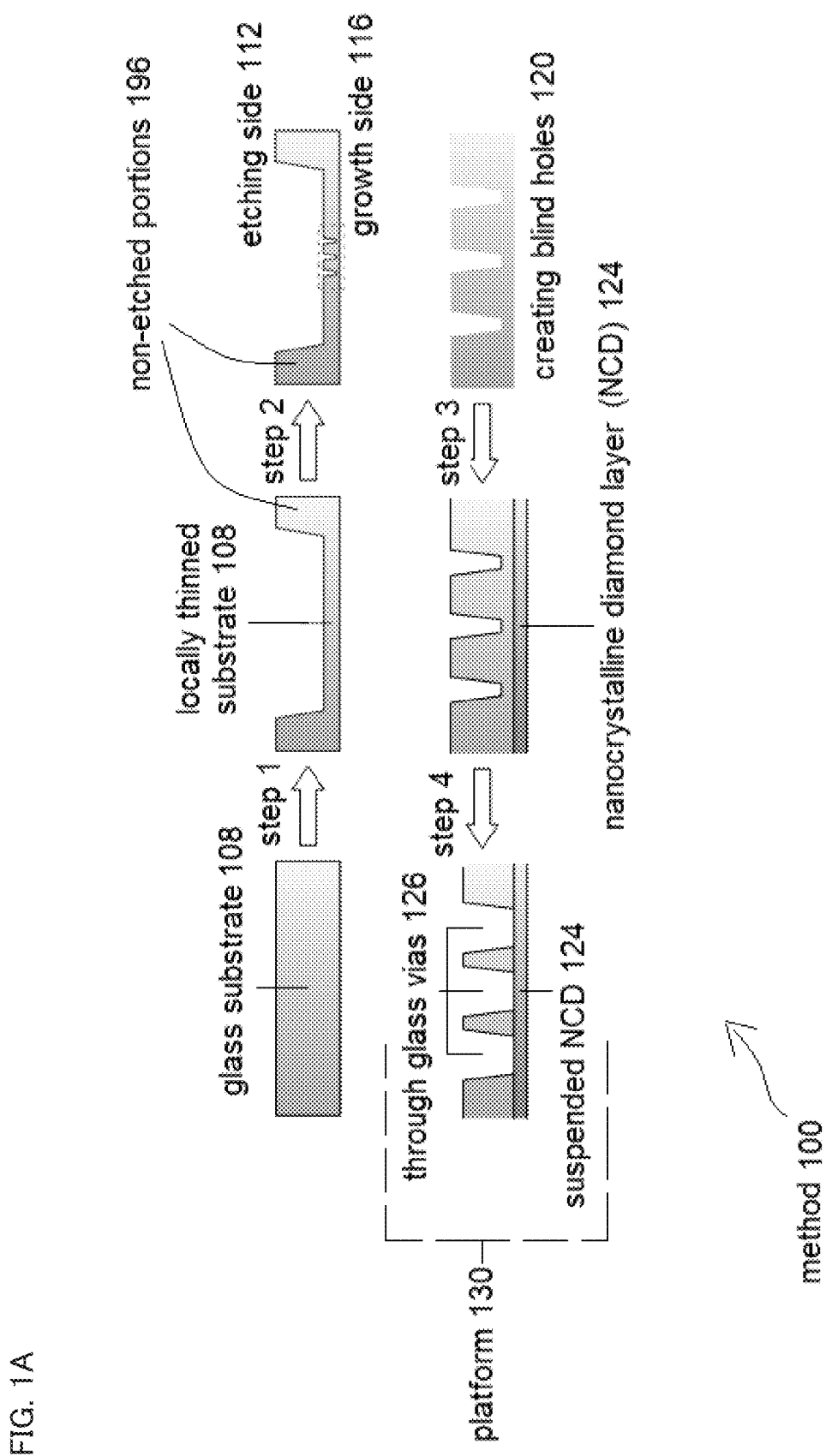
FIG. 1A shows a schematic of the cross-section of a glass substrate before and after each fabrication step.

FIG. 1A shows a schematic of method 100 including cross-sections of a glass substrate 108 before and after each of a series of fabrication steps 1-4. A schematic of a proprietary chemical reactor 104 used to etch glass substrates 108 appears in FIG. 1B, and sample images at each stage of the fabrication process appear in FIG. 1C-G.

Specifically, FIG. 1A shows changes in the cross-sections of the substrate 108 before and after steps in the fabrication process of through glass vias (TGVs) 126 that are sealed with portions of a nanocrystalline diamond (NCD) film.

In step 1, a glass substrate 108 of approximately 200 μm thick is locally etched (thinned) by hydrofluoric acid (HF) on an etching 112 side to a thickness of e.g. approximately 50 μm. A non-etched portion 196 of the substrate 108 serves as a supporting frame for the etched portions. In step 2, blind holes 120 of approximate diameter 42 μm and approximate depth 40 μm are made by laser ablation. In step 3, an NCD film 124 of predetermined thickness, in an embodiment e.g. less than 180 nm, is grown on a growth side 116 of the substrate 108. In step 4, HF etching is done locally to form the NCD sealed TGVs 126. Within the neighborhood of the TGVs 126, the substrate 108 is of approximate thickness 25 μm, and the NCD layer (film?) 124 is suspended from the growth side 116 of the glass substrate 108.

An important terminology issue will now be addressed. Within this disclosure, both etching and ablation are used to remove portions of the glass substrate 108. It will be understood that etching refers to chemical etching, and ablation refers to laser ablation.

Step 1 and step 4 can be performed in up to 25 min and 35 min, respectively, or in less time. During the various etching steps (e.g. at least steps 2 and 4), a crust of fluorides forms on the surface of the glass substrate 108. After etching, that crust can be removed by rinsing with deionized water.

Figure 1B:
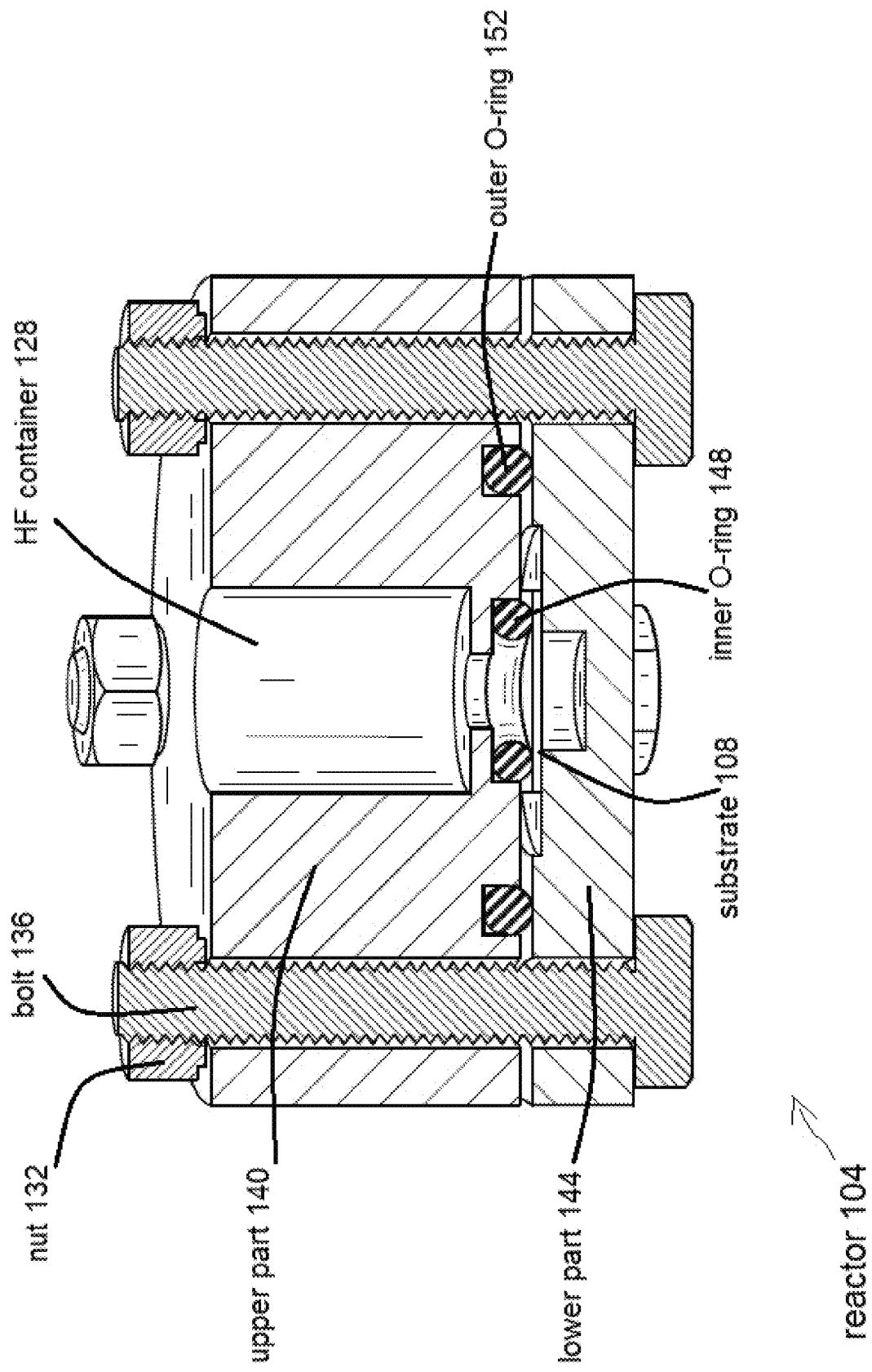
FIG. 1B is a schematic of a proprietary chemical reactor used to etch glass substrates.

FIG. 1B shows a cross-section of the proprietary chemical reactor 104 used to etch the glass substrates 108 discussed herein. Specifically, FIG. 1B shows a cross-section of the reactor 104 used for etching the glass substrate 108 using hydrofluoric acid (HF). The reactor 104 is designed to partly expose one surface of the substrate 108 to HF. By tightening the four nuts 132 and bolts 136, the inner O-ring 148 of the reactor 104 presses the upper part 140 of the reactor against the surface of the substrate that is in contact with the lower part 144 of the reactor.

In the upper part 140, a through hole is present that acts as a container in which up to 0.8 ml of the HF can be placed. The inner O-ring 148 sits around this through hole, has an inner diameter of 5.8 mm, and keeps the HF within the HF container 128. Meanwhile, the outer O-ring 152 is clamped by four bolts 136 between the upper part 140 and the lower part 144 and has an inner diameter of 17.8 mm. This outer O-ring 152 acts as a safety barrier against leakage of the HF. The outer O-ring also allows the reactor to be fully immersed in HF. This allows the upside-down etching.

In an embodiment, the O-rings 148, 152 are made of perfluoro rubber and all other parts of the reactor are made of polytetrafluoroethylene (PTFE). Both perfluoro rubber and PTFE are strongly resistant to HF.

Figure 1C:
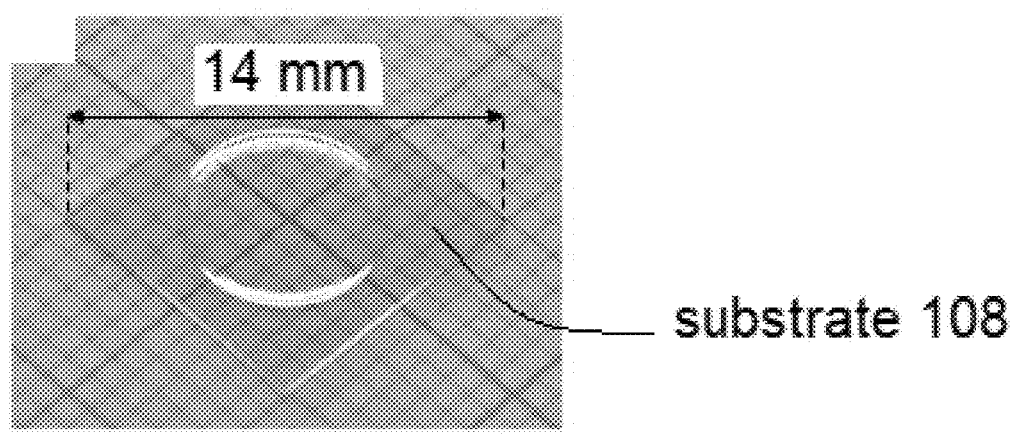
FIG. 1C shows an example glass substrate 108, laid out on graph paper.

FIG. 1C shows an example glass substrate 108, laid out on graph paper, where that substrate 108 has just completed step 1 and prior to step 2.

Figure 1D:
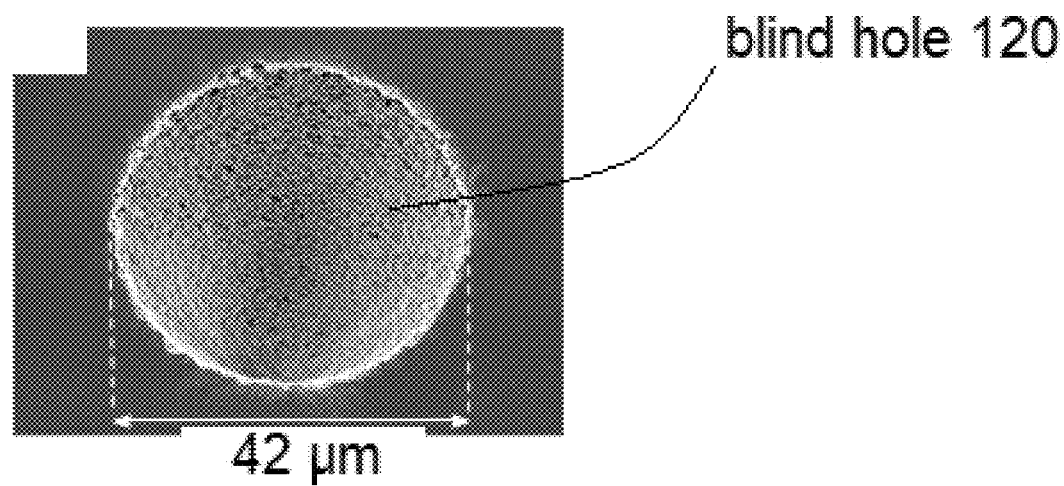
FIG. 1D shows an SEM image of a blind hole taken under a tilt of 25°.
Figure 1E:
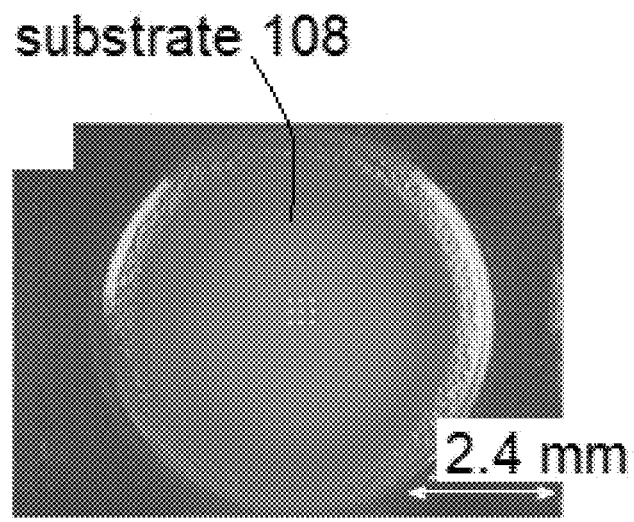
FIG. 1E shows a substrate after NCD growth from the PoV of the growth side.
Figure 1F:
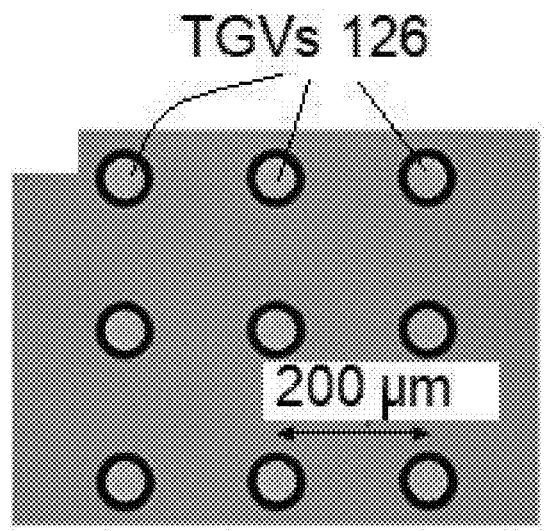
FIG. 1F shows a micrograph of nine TGVs sealed with suspended NCD of thickness 175±5 nm.
Figure 1G:
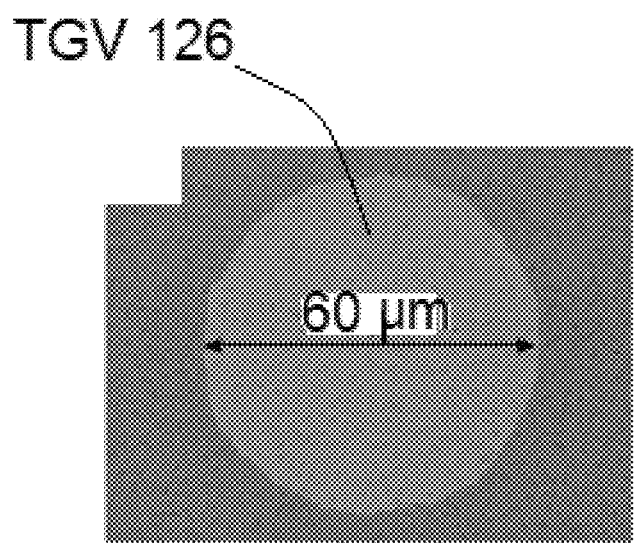
FIG. 1G shows a micrograph taken on a growth side of the substrate, in which a circular shape represents the suspended portion of the NCD film.

FIG. 1D is an SEM image of a blind hole 120 made by the laser ablation techniques discussed herein. The image of FIG. 1D was captured using a tilt of 25°. FIG. 1E shows an example glass substrate 108, taken with the camera on the growth side 116, immediately after diamond growth. FIG. 1E shows example variations in film thickness are observable from differences in the apparent color of the NCD film due to thin-film light interference;

FIG. 1F shows an array of NCD sealed TGVs 126 taken with a reflecting light microscope with the objective on the etching side 112. FIG. 1G shows an example TGV 126, taken with the same reflecting light microscope of FIG. 1F but with the objective on the growth side 116. The circular structure represents the center TGV 126 of FIGS. 1F and 1s visible due to the difference between the refractive index of air and glass.

Glass Substrates and Etching

In an embodiment, a 200 μm plate comprising an alkaline earth boro-aluminosilicate is diced, thereby yielding a plurality of 10×10×0.2 mm³ substrates. In an embodiment, the plate can be e.g. Corning Lotus NXT glass. After dicing the plate, the substrates are cleaned for 20 min in acetone with an ultrasonicator. The remaining acetone is then rinsed from the substrates with deionized water.

Some example properties of various glass components are listed in Table 1.

Within the embodiments herein, some roughening of the glass substrate 108 is tolerated, but it is desired to minimize roughening, as surface roughness may affect the transparency of the glass substrate 108. Specifically, the higher the concentration of HF used to etch the glass substrate 108, the faster the glass etches and the lower the surface roughness is. However, etching with lower concentrations can give more precision in depth of the etch achieved.

Accordingly, in an embodiment, one way to address this is within step 1 (the glass thinning step), use 48 m % HF and etch to roughly 150 μm. Then, in step 4, use 11 m % HF to etch with precision so that the glass substrate 108 is about 25 μm.

Next, adding hydrochloric acid to HF provides an effective way to dissolve the fluorides referred to above. In addition, any sedimentation of these fluorides is avoided by vertically orienting a surface of the glass substrate 108 being etched, partly because gravity drags the fluorides away from the surface, thereby preventing unwanted masking. One potential way to achieve this is to fully immerse the reactor in HF and turn the reactor 104 upside down.

Within the embodiments herein, glass etching can be done in a class 1000 cleanroom at a temperature of 23° C. and a humidity of 60%. In step 1, 0.6 ml of 48 m % HF was used. Since the etching rate for 48 m % HF was found to be too high for the controlled etching in step 4, 11 m % HF can be

TABLE 1

Types of glass that are suitable to grow nanocrystalline diamond on and their properties.

| | Types of glass usable for substrate 108 | | | | |
|---|---|---|---|---|---|
| Properties | Schott AF45 | ACC AN100 | Corning Lotus NXT | Corning Eagle 2000 | ACC Fused Silica |
| Annealing point[a] [° C.] | 663 | 720 | 806 | 722 | 1120 |
| Average CTE[b] [10⁻⁶/° C.] | 4.5 | 3.8 | 3.5 | 3.2 | 0.6 |
| Density (25° C.) [g/cm³] | 2.72 | 2.51 | 2.59 | 2.37 | 2.20 |
| Resistivity (250° C.) [Ω cm] | 6 10¹³ | 4 10¹³ | 25 10¹³ | 0.3 10¹³ | 0.2 10¹³ |
| Young's modulus (25° C.) [GPa] | 66 | 77 | 83 | 71 | 74 |

[a]The temperature at which the viscosity of the glass is $10^{13}$ Pa s.
[b]Linear coefficient of thermal expansion averaged from 0 to 300° C. For diamond, the value for this property is about 0.000001 1/C.

One important property of the glass substrates 108 used in the embodiments here is that all glass substrates 108 should be assumed to have a growth side 116 and an etching side 112, as shown at least in FIG. 1A.

The isotropic etching of silicon dioxide-based glass referred to herein is typically done with HF. The overall chemical reaction for etching silicon dioxide glass with HF is . . . .

[Chem. 1]

$$SiO_2 + 6HF \rightarrow H_2SiF_6 + 2H_2O. \quad (1)$$

It is important to note that equation (1) represents a simplification of what occurs during the etching steps described herein. The etching rate of silicon dioxide-based glass with HF typically increases with temperature, hydrogen fluoride concentration, and the concentration of species other than silicon dioxide. To synthesize a silicon dioxide-based glass with specific properties, well-defined amounts of oxides such as $Al_2O_3$, $As_2O_3$, $B_2O_3$, CaO, $K_2O$, MnO, $Na_2O$, and $P_2O_5$ are mixed with $SiO_2$. These oxides react with HF to form fluorides that are insoluble in HF and which sediment onto portions of the etching surface, thereby leading to roughening.

used in step 4. However, the embodiments herein are not limited to these specific concentrations. These concentrations are shown merely for example only.

Laser Ablation

Figure 3:
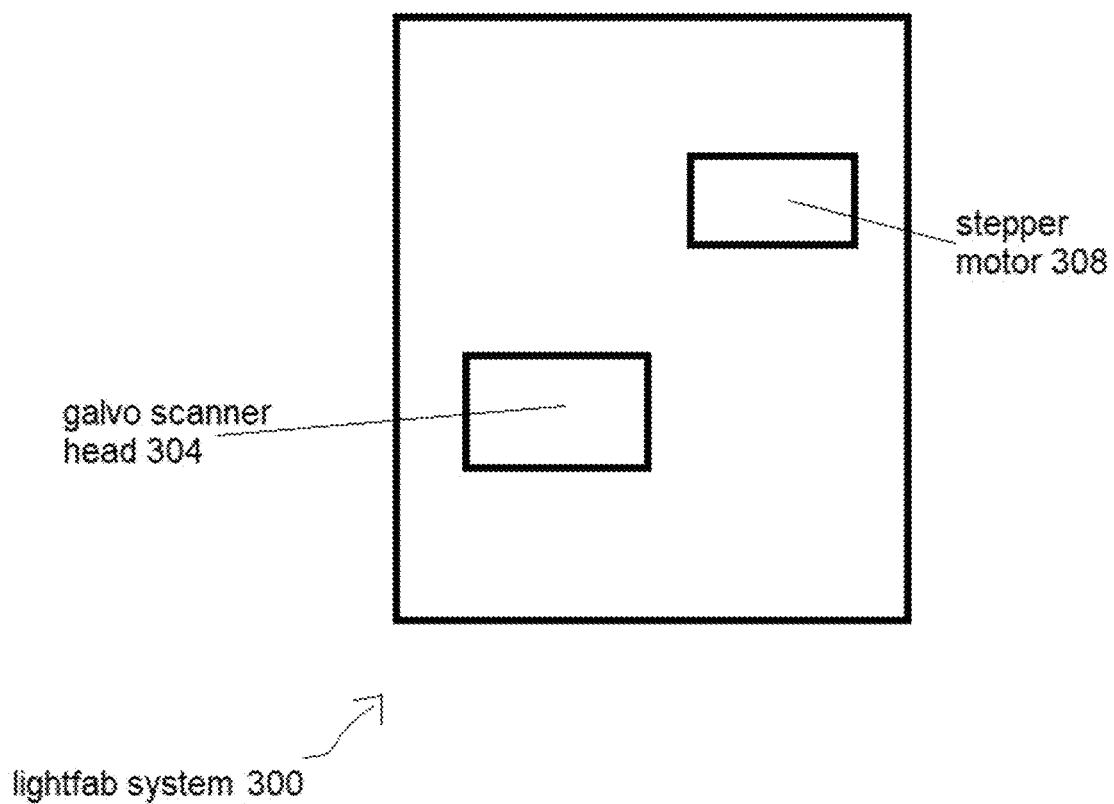
FIG. 3 shows an example lightfab system.

In an embodiment, the blind holes 120 are made with a lightfab system 300 designed for selective laser-induced etching of fused silica. As shown in FIG. 3, the lightfab system 300 comprises a 4 W laser. The laser light, of wavelength 1030 nm, is focused with a microscope objective to a spot of approximate diameter 1 μm. In an embodiment, the objective has a numerical aperture of 0.4, magnified 20 times, and had a working distance of 10 mm. However, other parameters could also be used. The galvo scanner head 304 of the lightfab system 304 allows the focal plane F to move in three dimensions and with a stepper motor 308. The stage of the system 300 could also move in three dimensions.

The front side laser ablation techniques described herein create suitable blind holes 120 where the substrate 108 is etched at a maximum of approximately 50 μm. The depth f of F (focal plane), measured relative to the surface located at the etching side of the substrate 108, is typically changed with the stepper motor 308 rather than with the galvo 304, thereby overcoming software issues.

Formation of cracks during ablation is minimized partly by using a laser pulse frequency of e.g. 500 kHz, a pulse duration of approximately e.g. 270 fs, and a write speed of e.g. 150 mm/s. With these parameters, an ablation threshold of a surface of the glass substrate 108 was found to occur at laser power P=0.33, where P denotes the laser power scaled by the maximum laser power. To avoid confusion, it should be noted that within this disclosure, a different P (non-italic), will connote Pressure (not laser power). The reader is cautioned to not confuse P (pressure) with P (laser power).

In one embodiment, an example pattern written during laser ablation consists of 20 concentric circles each of which are separated from immediate neighbors by 1 μm. The largest circle has diameter 40 μm, while the smallest circle has diameter 2 μm, and the sequence of writing proceeds from the circle of largest diameter to the circle of smallest diameter. To effectively create blind holes 120, one example technique is to sequentially write the pattern and lower focal plane F to a prescribed depth f.

NCD Growth

During the chemical vapor deposition of an NCD film, a temperature $T_s$ of the substrate during a growth process typically ranges from 500° C. to 900° C. For the embodiments herein, glasses with annealing points above 500° C. are therefore preferable. To avoid stress due to thermal mismatch between the glass and the NCD, the glass substrate 108 is custom-designed and custom-manufactured to have a coefficient of thermal expansion equal to that of NCD for the complete range of temperatures achieved during the growth process.

Several types of silicon dioxide-based glass on which NCD can be grown have annealing points above 500° C. Some example glasses that can be used for NCD growth are listed in Table 1, together with some of their salient properties. Except for fused silica, the glasses listed in Table 1 are designed to be used in conjunction with silicon.

Preceding NCD growth, the substrate 108 is cleaned. After cleaning, the surface on the growth side 116 was seeded with detonation nanodiamonds of diameter below 10 nm. Although nanodiamonds are chemically bonded to a matrix of $sp^2$ hybridized carbon after synthesis, the nanodiamonds can be separated by bead milling. Within this disclosure, the expression to "$sp^2$ hybridized carbon" will be understood to mean hybridized carbon arranged in a way that is different than how carbon is arranged within e.g. diamond.

Using a powder of such separated nanodiamonds, a stable colloidal suspension is achieved by first mixing 0.1 g of the powder in e.g. 0.2 l water (approximately 0.05 m %) and then ultrasonicating the mixture using an ultrasonic probe with a tip of diameter 3.2 mm and length 4.5 cm. The probe is then connected to a transducer of power 100 W and frequency 20 kHz that was set to cycle on and off every second for 90 min.

The obtained suspension may be turbid at first, but eventually clears with the settling of particles. After mounting the substrate 108 on a spin coater, 40 μl of the suspension is drop cast on the substrate 108. Alternatives to drop casting can include but are not limited to submerging the substrate in the suspension, squirting the suspension on the substrate, and potentially other methods. At e.g. one minute after drop casting, the surface of the substrate was flushed for 10 s with deionized water while the substrate was spinning at 4000 rpm. This strategy was used to avoid any aggregation of nanodiamonds.

Simply dipping the substrate 108 in deionized water also leads to satisfying results, but can lead to unintentional seeding of substrate surfaces that should remain unseeded. After flushing, the substrate 108 is dried by spinning for an additional 15s without changing the spin frequency.

The seeded substrate 108 is then placed in the reactor 104, which in an embodiment can be e.g. a Comes SDS6500X microwave plasma-assisted chemical vapor deposition (MWPACVD) system having a molybdenum substrate holder of 58 mm diameter and 5.5 mm thickness. Subsequently, any gases in the reactor 104 are evacuated by a dry pump to a base pressure of 8.5 Pa.

Hydrogen gas and methane gas are next introduced into the reactor 104 at respective flow rates of 294 sccm and 6 sccm. After reaching a stable operation pressure e.g. P=2 kPa, the gases are then ignited into a plasma with 1.5 kW of 2.45 GHz microwaves. At these conditions, the substrate temperature $T_s$ remained relatively far below the annealing point of glass substrate 108 which is 722° C., and the growth rate r can be on the order of 1 nm/min.

This value of r typically occurs at relatively low values of $T_s$ and P. The thicknesses of the NCD films 124 were measured during growth with an interferometer. During growth, a light gray film, consisting potentially of hydrogenated carbon, may sometimes be unintentionally deposited on the etching side 112 of the substrate 108. In such a case, this film can be removed by gas plasma reactor system, in an embodiment a Yamato PR200.

Characterization and Verification

The photographic images shown in FIGS. 1C-1G, 2D-2I, and 5A-5C can be taken, for example, with an SEM (Scanning Electron Microscope) having a 5D camera and a 65 mm lens. Surface profile features with lengths greater than 1 mm can be photographed with a stylus profilometer and surface profile features with lengths less than 1 mm can be photographed with a laser microscope. In an embodiment, an arithmetic average surface roughness $R_A$ was deduced. An SEM can also be used to measure the thicknesses of the glass substrates, including computing a refractive index. In an embodiment, an example refractive index might be 1.53. An SEM can also be used as a reflected-light microscope and a dark field scope is used to perform dark-field microscopy. The thicknesses of the NCD films were measured with higher resolution than during growth using an optical nano gauge. In an embodiment, a Hamamatsu C13027 serves as the optical nano gauge.

An SEM is used to examine the blind holes 120, the NCD films 124, and the TGVs 126. In an embodiment, the SEM can be a FEI Quanta 250 FEG and\or a JEOL JSM-7900F.

Grazing incidence X-ray diffraction measurements were carried out on the NCD films with a diffractometer, using Cu $K_\alpha$ X-rays of e.g. 0.15418 nm average wavelength. The angle of incidence β of the X-ray beam with the samples was 0.5°, which is slightly above the critical angle $\beta_c$=0.27° of total external reflection for a diamond-air interface.

Figure 7A:
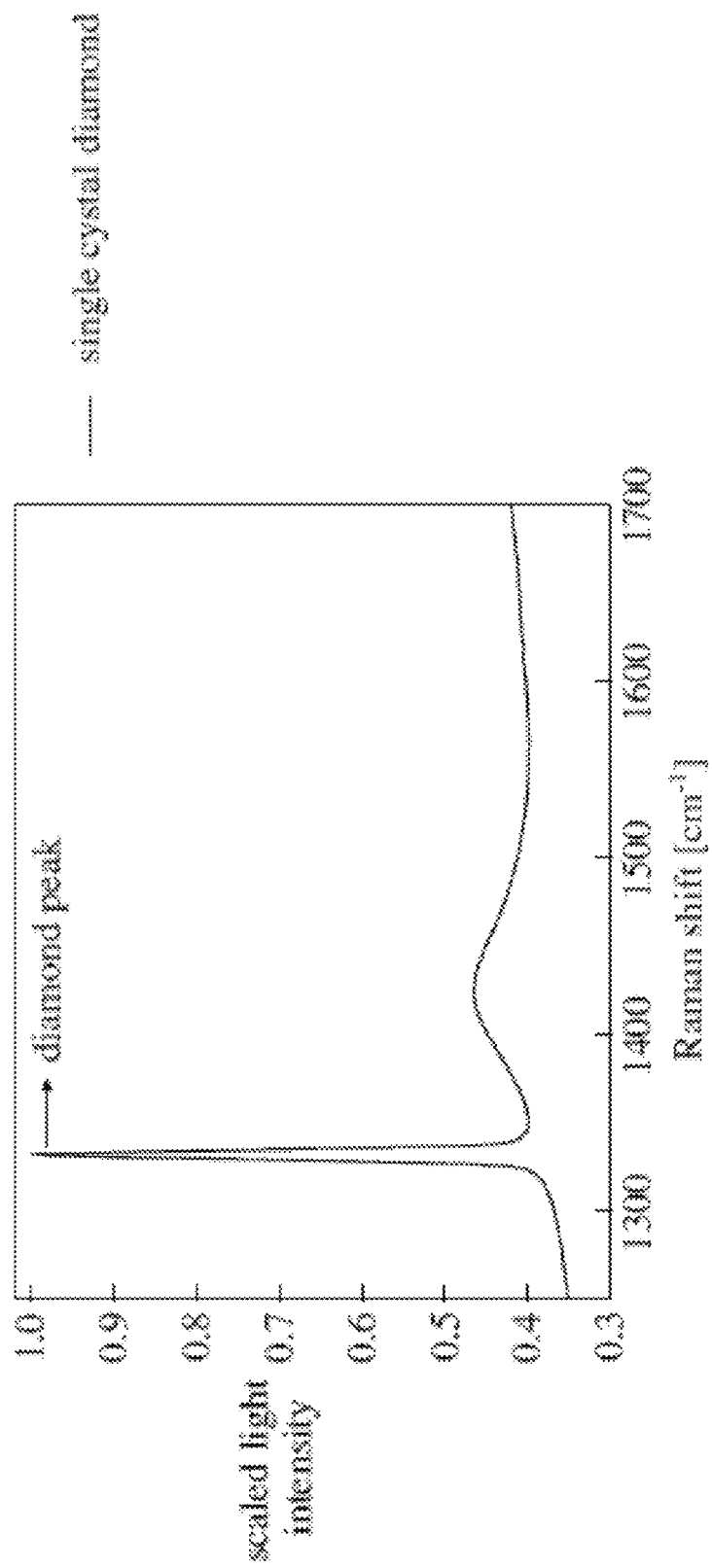
FIG. 7A depicts scaled Raman spectra of a 3×3×0.3 mm³ single crystal diamond and of the NCD film depicted in FIG. 4B.
Figure 7B:
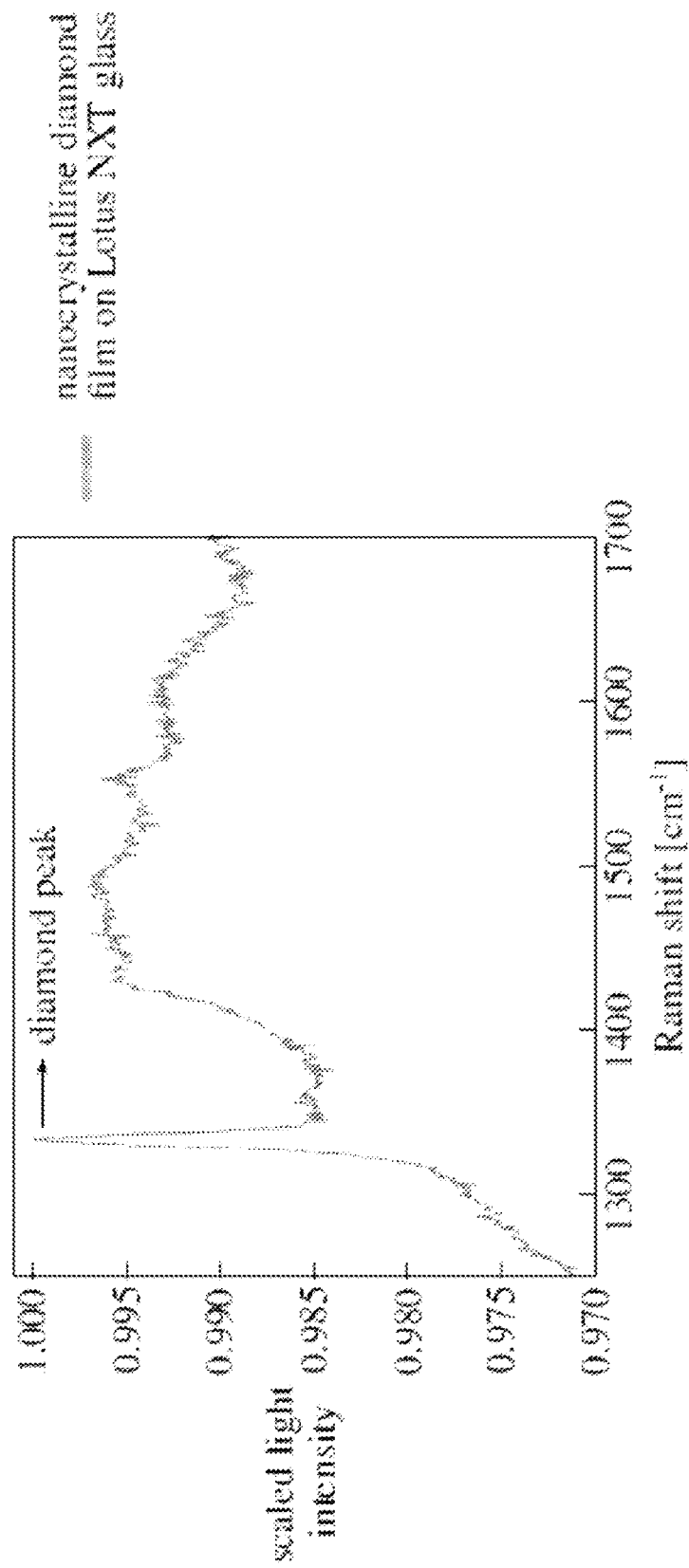
FIG. 7B depicts scaled Raman spectra of a 3×3×0.3 mm³ single crystal diamond and of the NCD film depicted in FIG. 4B.
Figure 7C:
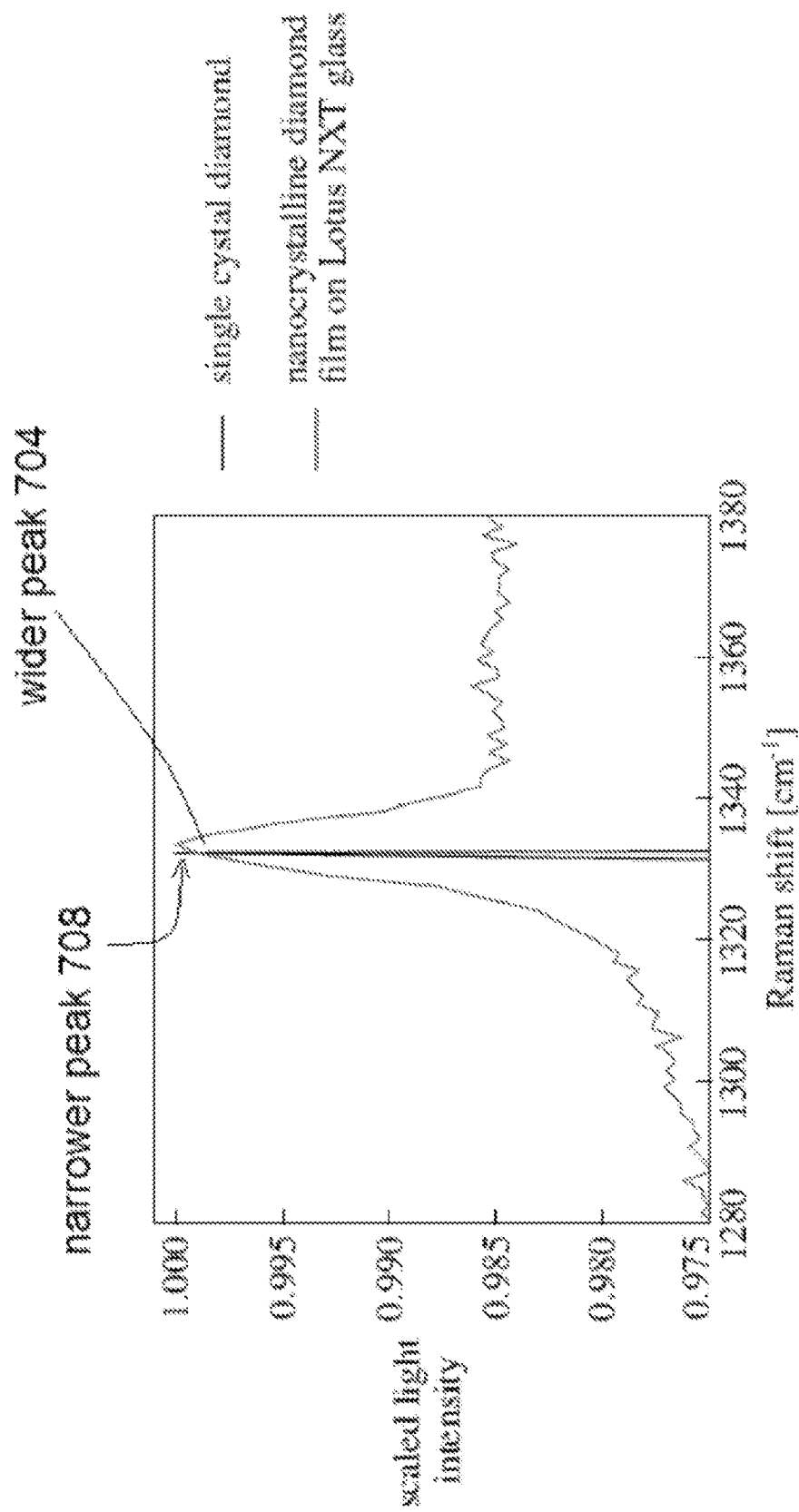
FIG. 7C shows a zoom-view of the peaks shown in FIGS. 7A-7B.

Raman spectra, for example the Raman spectra of FIGS. 7A-7C, are measured using a 5 mW 532 nm laser focused by an objective lens on a sample to a spot of less than one micrometer in diameter, which magnifies 100 times and has a numerical aperture of 0.95. Pressure was applied to the platform. Functions were fitted to the data using e.g. an lmfit Python library.

Glass Etching

The etching times for steps 1 and 4 were arrived at by systematic studies. The results for 48 m % and 11 m % HF solutions are presented in FIGS. 2A and 2B respectively, which show the maximum etch depth d that is reached as a function of time t for each of these concentrations. Each data point on the log-log graphs represents one experiment and t and d have respective errors of approximately 10 s and 3 μm. FIG. 2C shows a typical surface profile taken after etching a substrate 108.

Figure 2A:
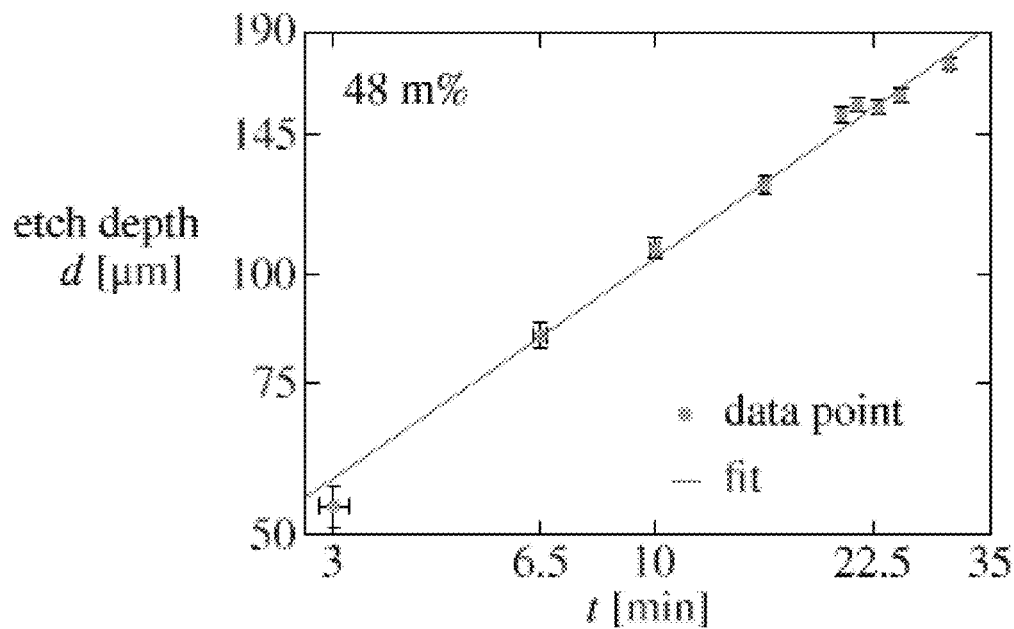
FIG. 2A shows data fitted using an lmfit Python library.

FIG. 2A shows a Log-log graph of the maximum etch depth d reached in the glass substrate 108 by HF etching versus etching time t. The substrate 108 is etched locally around its center with 48 m % HF. Each data point is obtained from one experiment and the least-squares method is used to fit the data.

Figure 2B:
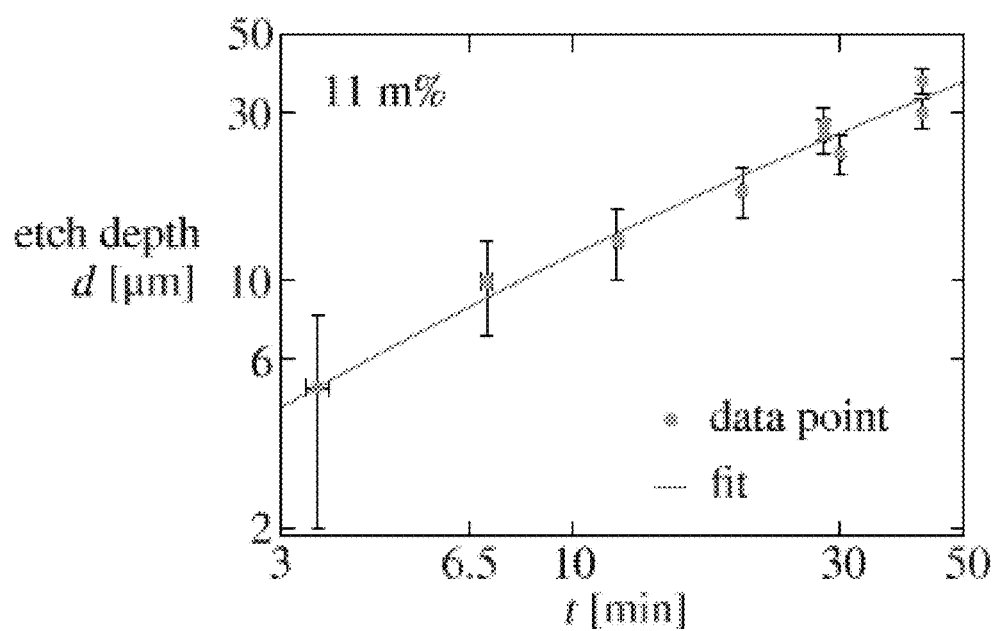
FIG. 2B shows data fitted using an lmfit Python library.
Figure 2C:
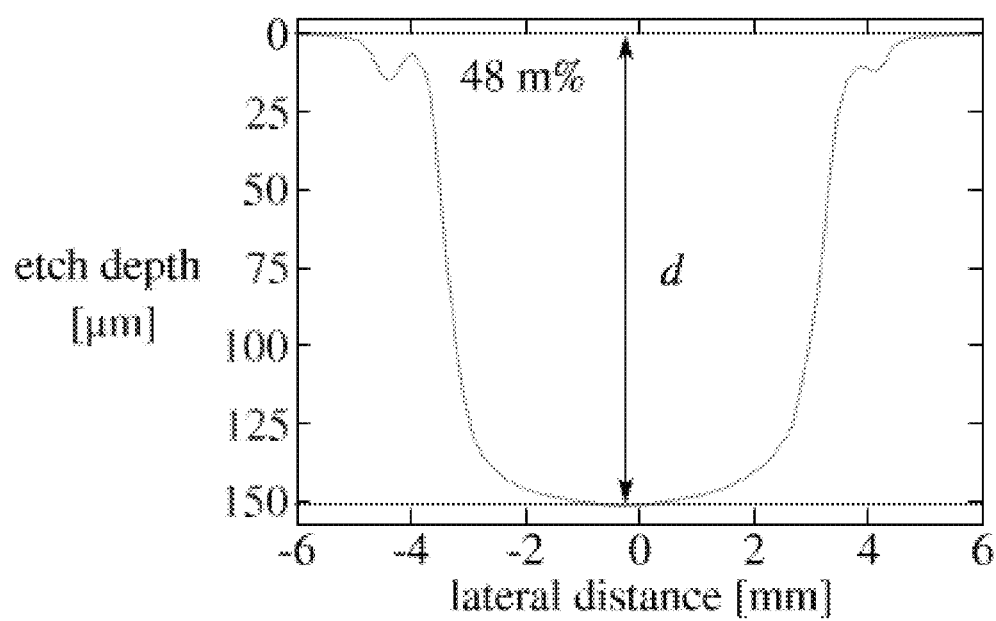
FIG. 2C shows a typical surface profile taken after etching a substrate.
Figure 2D:
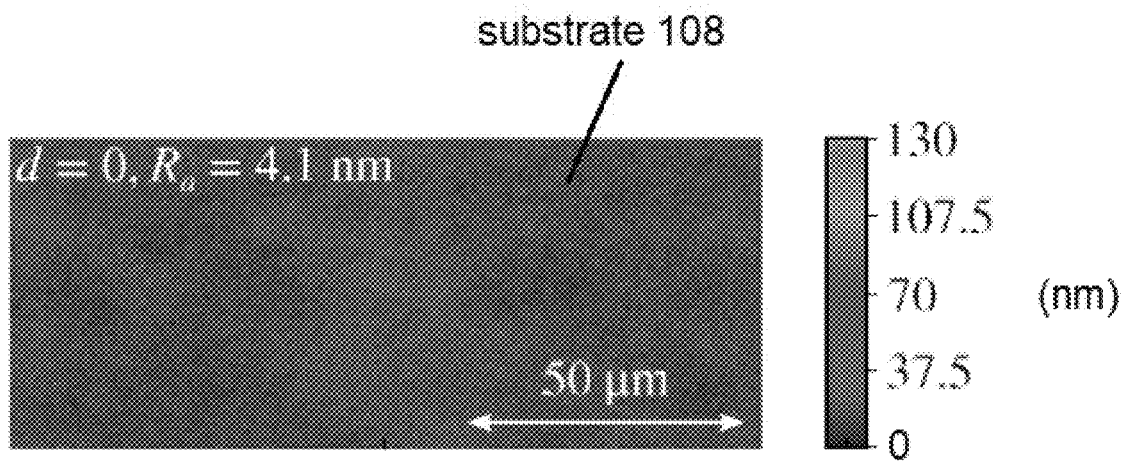
FIG. 2D shows surface profiles of the glass substrate at various stages of development.
Figure 2E:
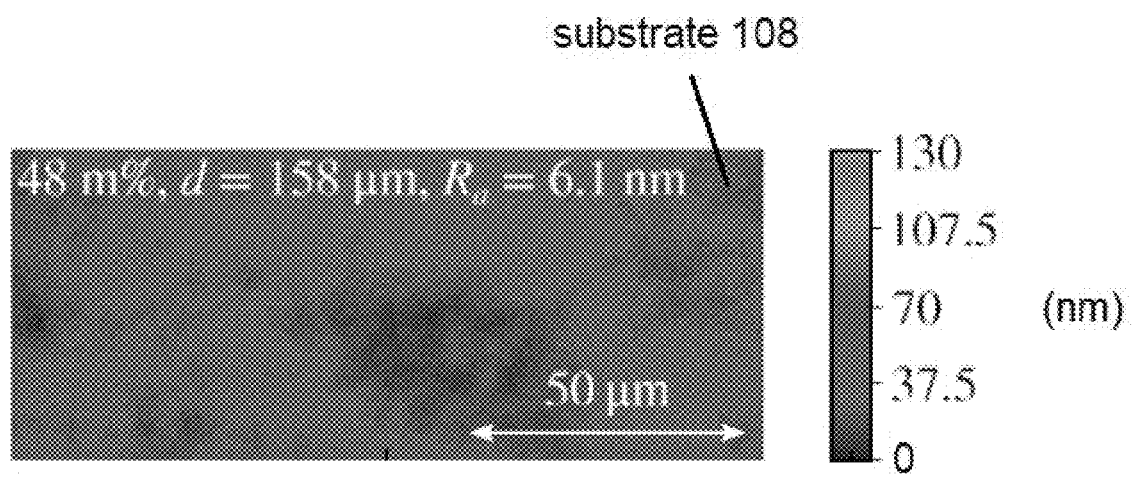
FIG. 2E shows surface profiles of the glass substrate at various stages of development.
Figure 2F:
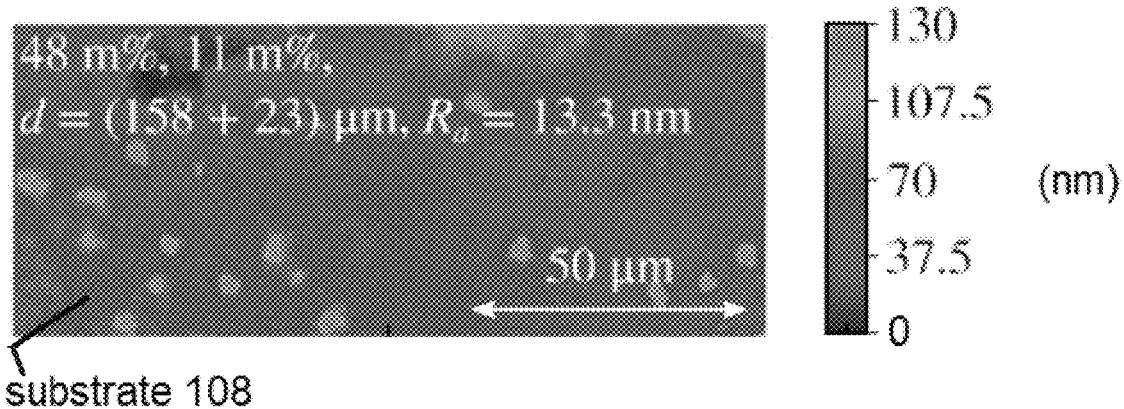
FIG. 2F shows surface profiles of the glass substrate at various stages of development.
Figure 2G:
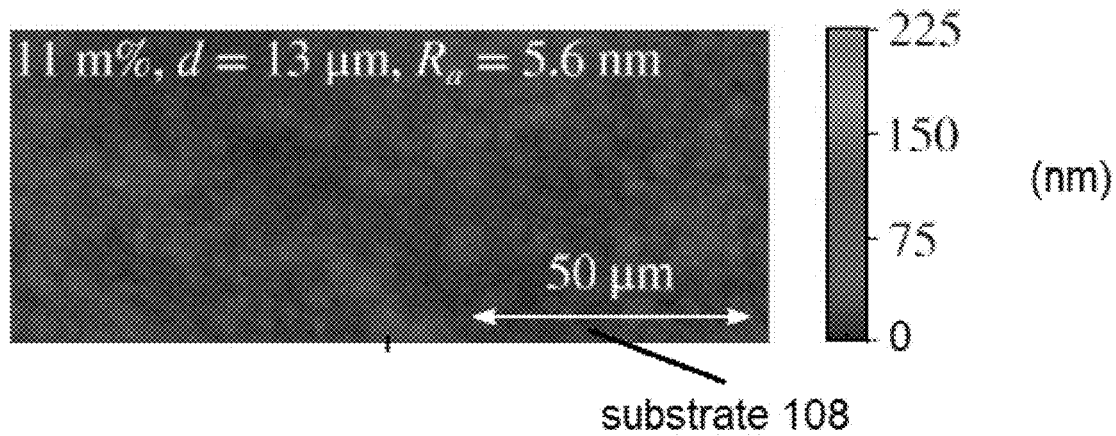
FIG. 2G shows the surface profiles of glass substrates etched with predetermined levels of HF to predetermined depths.
Figure 2H:
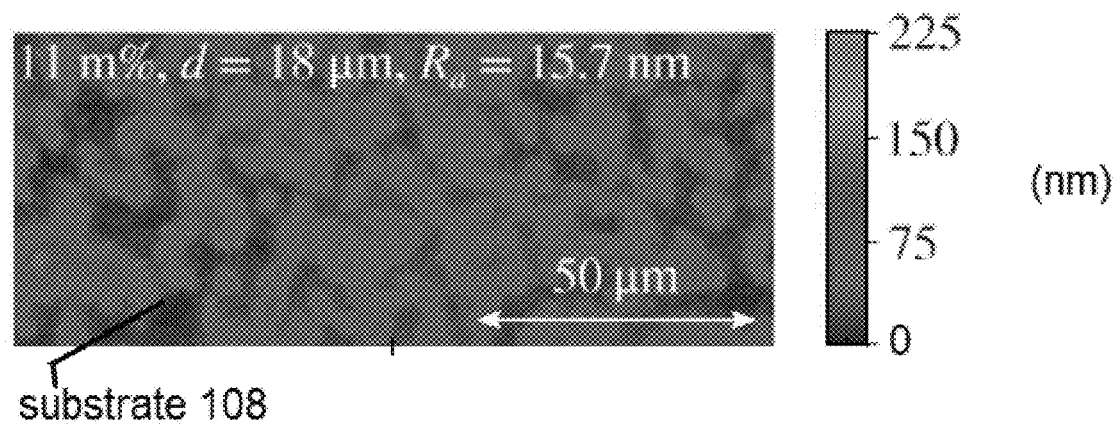
FIG. 2H shows the surface profiles of glass substrates etched with predetermined levels of HF to predetermined depths.
Figure 2I:
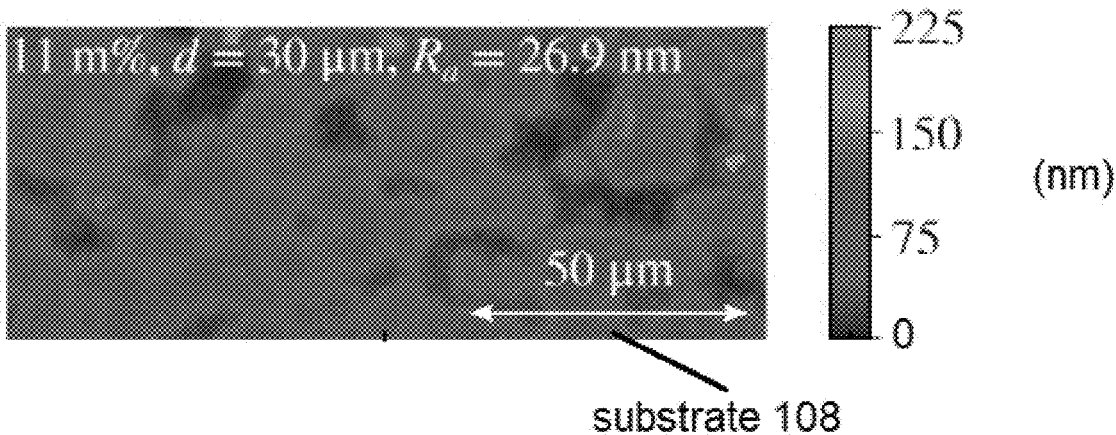
FIG. 2I shows the surface profiles of glass substrates etched with predetermined levels of HF to predetermined depths.

FIG. 2B shows data for the same experiment as in FIG. 2A but with 11 m % HF. FIG. 2C shows surface profile of a substrate that is locally etched by HF with d approximately 150 μm. FIGS. 2D-F are surface profiles of a glass substrate 108 before etching, after etching to a depth of 158 μm with 48 m % HF during step 1, and after additionally etching 23 μm of the substrate with 11 m % HF during step 4, respectively. The symbol $R_A$ denotes the arithmetic average roughness of the surface. FIGS. 2G-I show surface profiles of glass substrates 108 after etching 13 μm, 18 μm, and 30 μm of pristine glass substrates with 11 m % HF, respectively.

Within the embodiments herein, it can be advantageous to predict a time t necessary to etch a certain depth d. Accordingly, various models to describe the oxidation of silicon can be used. Some models assume steady-state diffusion, a first order chemical reaction, and a concentration of HF $c_0$ at d=0 that is constant with the time t. Under these assumptions, the time-evolution of the depth d can include the product of a stoichiometric constant $c_g$ and the concentration of species in glass that react with HF, a reaction constant k, and a diffusion coefficient D.

Using data-fitting (AKA curve-fitting), it becomes apparent that depth d is roughly proportional to t for a reaction-limited process, and that d is roughly proportion to a square root of the time t for a diffusion-limited process. In an embodiment, the data-fitting is performed using an lmfit Python library.

When fitting the general relation for a power law to the data for 48 m % HF etching, the power of t is 0.48±0.2, from which it is reasonable to assume that the etching process is diffusion-limited. For 11 m % HF etching, the power of t is 0.72±0.08, which indicates that the etch process is on a border between reaction-limited and diffusion-limited. A Damkoehler number assists in understanding the effect of HF concentration and duration on the etching process.

Through experimentation, computation, and data-fitting (curve-fitting), Applicant has found that a reaction rate to the diffusion rate as follows: for DA>>1, the etching process is diffusion-limited; for DA<<1, the etching process is reaction-limited. Applicant concludes that the glass etching process is reaction-limited for relatively small values of t, but becomes diffusion-limited for relatively large values of t. Diffusion-limited behavior is achieved more rapidly for higher initial concentrations of HF.

The effect of HF etching on the surface roughness $R_A$ of a glass substrate was also investigated, in that rough surfaces can scatter light, adversely affecting transparency, thereby making the embodiments herein less effective. Prior to etching, the value of surface roughness $R_A$ for a glass substrate was approximately 4 nm or less. During etching in step 1, surface roughness $R_A$ increased up to 6 nm in the vicinity where d was measured. Moreover, during etching in step 4, surface roughness $R_A$ is increased to approximately 13 nm. This cumulative increase in $R_A$ is evident in FIG. 2D-F, which depicts the surface profile of the glass substrate 108 before step 1, between steps 1 and 2, and after step 4, respectively. It is important to note that surface roughness $R_A$ increased strongly after step 4, during which only approximately 25 μm was etched.

FIGS. 2G-I show the surface profiles of glass substrates etched with 11 m % HF to depths of approximately 13 μm, 18 μm, and 30 μm. These steps provide additional proof that etching the glass substrate 108 with 11 m % HF may induce more surface roughness $R_A$ than etching with 48 m % HF. Surface roughness affects transparency. The rougher the surface, the less transparent the glass substrate 108 becomes.

Assuming that masking of insoluble fluorides sedimented at an HF-glass interface causes surface roughening during etching, it is possible that for etching with 48 m % HF, the velocity of the HF-glass interface is larger than the sedimentation rate of fluorides. In any case, since step 4 utilizes shallow etching with 11 m % HF as discussed earlier, it is possible to keep the post-etching surface roughness $R_a$ of the glass substrate 108 to be relatively low.

Blind Holes

During the process of optimizing the parameters for laser ablation, formation of cracks became more apparent with increasing laser pulse frequency and P. To create blind holes at the lowest value of stable operation pressure P possible and thereby avoid crack formation, depth of a blind hole was measured as a function of pressure P for various choices of depth f.

To make the blind holes 120, the surface of the substrate 108 is placed at the focal plane F of the laser light in air and a pattern of concentric circles is written 5 times. F is then lowered to 5 μm and the pattern is written 5 times again. This procedure is repeated until the focal plane F reaches a predefined depth f measured from an etched surface of the substrate 108 to the focal plane F. Some aspects of this process are shown in FIG. 6.

Figure 6:
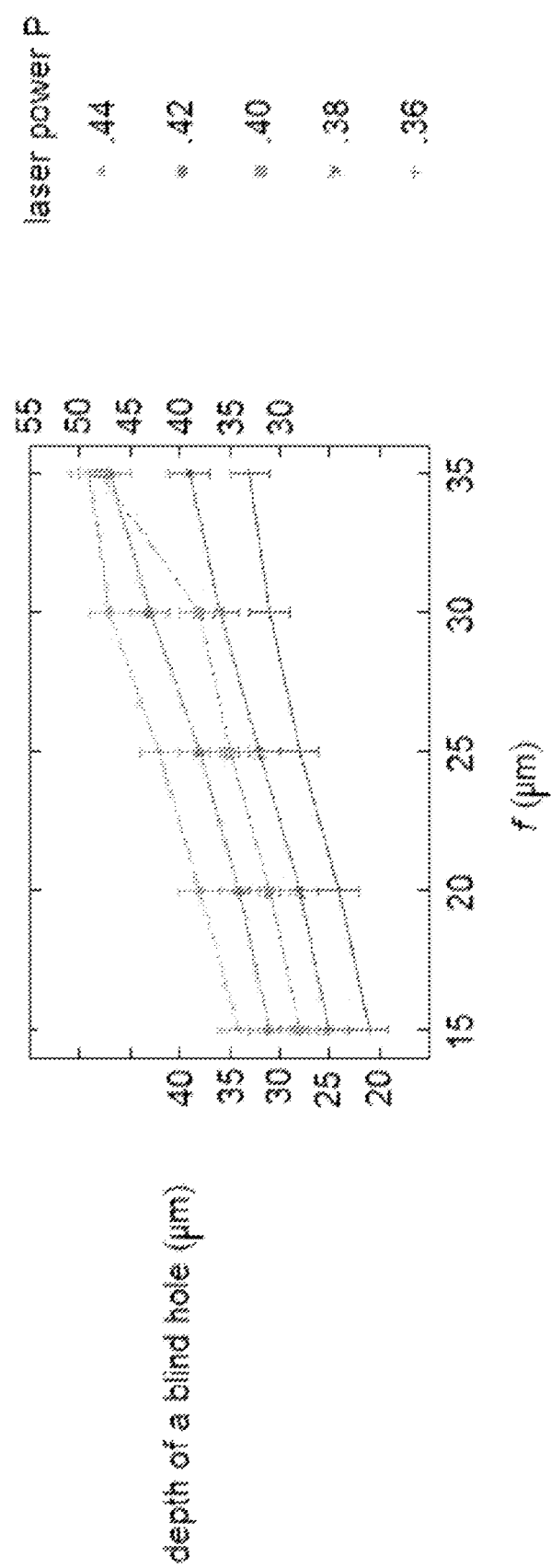
FIG. 6 shows the depth of 25 blind holes of 42 μm diameter that are made using the front side laser ablation technique in a 10×10×0.2 mm³ glass substrate on the etching side of the substrate.

FIG. 6 shows the depth of 25 blind holes 120 of e.g. 42 μm diameter that are made using the front side laser ablation technique in a 10×10×0.2 mm³ glass substrate 108 on the etching side 112. The blind holes 120 are made in the vicinity where the glass substrate is etched most and are of approximate thickness 50 μm. The depth of a blind hole 120 is given as a function of the depth f measured relative to the etched surface of the substrate and the laser power P scaled with the maximum power of the laser.

Viewing FIG. 6 from left to right, the depth f increases linearly from 15 μm to 35 μm and from bottom to top, the laser power P, scaled with the maximum laser power of the system used herein, increases linearly from 0.36 to 0.44. For a depth f=35 μm, the lowest value of laser power P at which blind holes of approximately 40 μm deep can be made is 0.38.

FIG. 1D shows an SEM image, taken under a tilt of 25°, of a blind hole 120 similar to those in FIG. 3B. From the image, it is clear that the shape of the blind hole 120 resembles that of a paraboloid. This is most likely a consequence of laser light shading by the glass substrate 108.

Nanocrystalline Diamond

In step 3, an NCD film 124 is grown on the surface of the glass substrate 108 with blind holes 120 on the growth side 116. During growth, the etching side 112 is not in direct contact with the cooled substrate holder of the CVD system. An X-ray crystallography study, from which the results are shown in FIG. 4A, confirms that crystalline films 124 were obtained from this growth process.

Figure 4A:
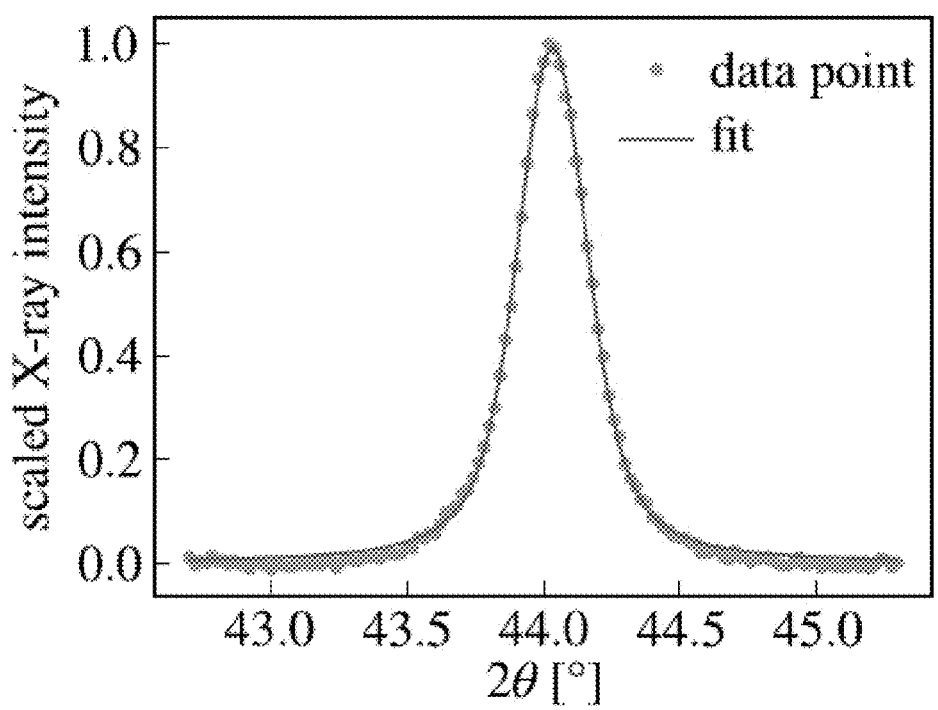
FIG. 4A shows an X-ray crystallography study confirming that crystalline films were obtained.

Specifically, FIG. 4A is asymmetric grazing incidence X-ray diffractogram of the NCD film grown in step 3, using a Voigt function fitted to the data. The intensity of the scattered X-rays is scaled and θ denotes a Bragg angle. The center of the peak is at 2θ=44.03±0.01°, which corresponds to constructive interference of copper $K_\alpha$ X-rays that are scattered by the crystal planes of diamond.

Figure 4B:
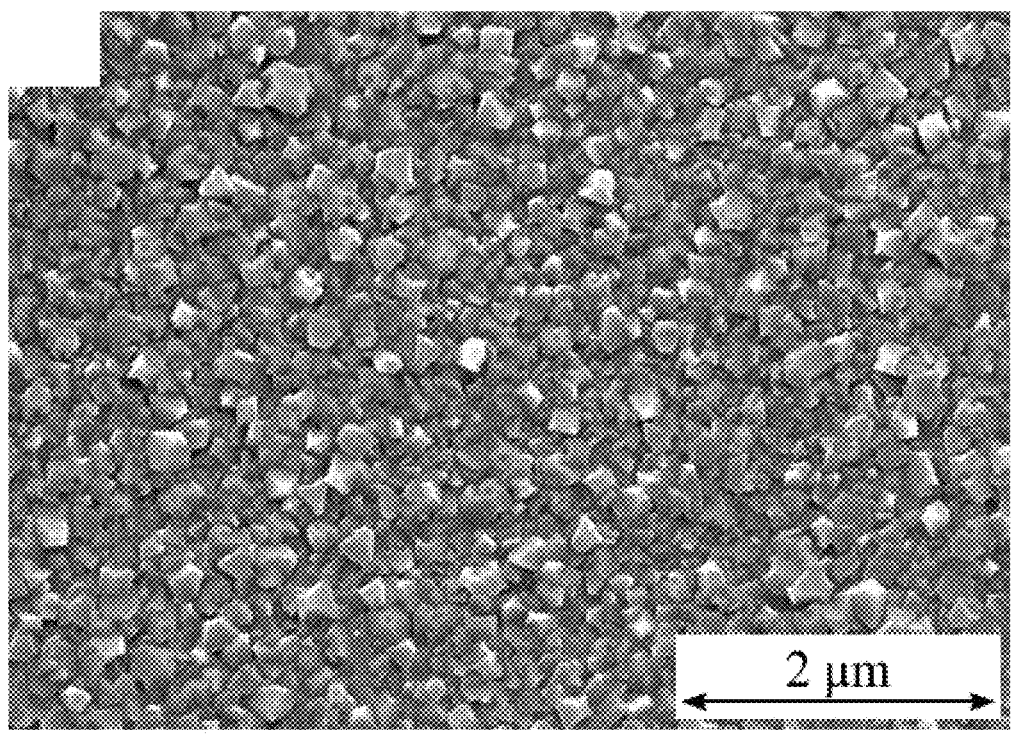
FIG. 4B shows an SEM image of the NCD film exhibiting a pinhole-free nanocrystalline structure.

FIG. 4B is an SEM image of the NCD film 124. FIG. 4B shows that the film 124 is pinhole-free and consists of nanoscopic diamond crystals.

FIG. 1E shows a photograph of a substrate after NCD growth that was taken with an SEM camera located on the growth side 116. The substrate 108 was placed on a mirror and therefore a large part of the light recorded by the camera was scattered, making it possible to observe the array of 9 blind holes.

FIG. 4B shows an SEM image of an example NCD film 124, which exhibits a pinhole-free nanocrystalline structure. At the thinnest part of the glass substrate 108, in the vicinity of the blind holes 120, the NCD film 124 is ~175±5 nm and from that area, moving radially towards the edges of the diamond film, reduces to approximately 120±5 nm. Due to thin-film interference, the variations in film thickness are observable from differences in the apparent color of the NCD film, as shown in FIG. 1E.

During growth of the NCD film/layer 124 (e.g. step 3), only the glassy substrate surface on the etching side 112 (where no thinning is performed) is in contact with the water-cooled substrate holder. Meanwhile the glass substrate surface on the opposite growth side is in contact with a plasma. It is therefore reasonable to assume that during growth, the temperature of the etched part of the glass substrate 108 is greater than the non-etched reminder of the substrate 108. As such, the growth rate of the NCD 124 increases monotonically. This means the growth rate of the NCD film 124 is spatially nonuniform. Since the growth time at all locations is the same, a nonuniform film thickness is expected.

By growing the NCD film 124 prior to etching (e.g. prior to step 4), variations in film thickness of the resulting film 124 are avoided. This is at least because the substrate 108 is an oxide and therefore barely interacts with air. Also, the softening point of the substrate lays at 1043° C., which makes it resilient against relatively high temperatures.

Formation of the Through Glass Vias (TGVs) 126

Figure 5A:
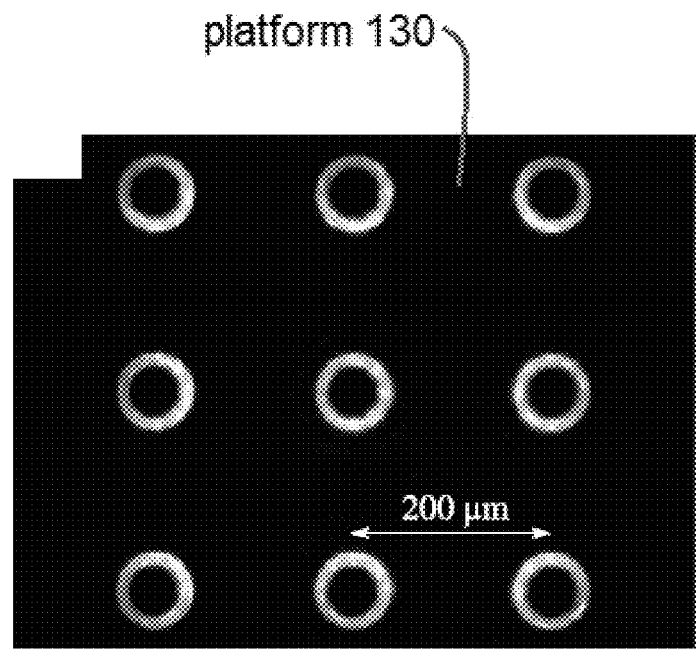
FIG. 5A is a dark-field optical microscope image taken on the growth side of the substrate, that captures the NCD-glass platform from FIG. 1F.

In step 4, the glass substrate 108 is further etched by HF to form through glass vias (TGVs) 126 that are sealed with suspended portions of the NCD film 124 having an approximate diameter of e.g. 60 μm FIG. 1F shows a micrograph taken on the etching side 112 of nine TGVs sealed with suspended NCD of thickness 175±5 nm. In the vicinity of these TGVs, the substrate is of approximate thickness 23 μm and light scattering causes the walls of the TGVs to appear as black circles. FIG. 5A is a dark-field optical microscope image, taken on the growth side of the substrate, capturing the same NCD-glass platform as FIG. 1F.

From this image it is apparent that despite the walls of the TGVs 126, the resulting platform 130 of substrate 108 and NCD layer 124 barely scatters any light. Specifically, FIG. 5A is a dark-field optical micrograph of the glass substrate 108 with NCD sealed TGVs 126 created according to the embodiments described herein. FIG. 5A captures the same NCD-glass platform 130 as shown in FIG. 1F, and shows that apart from the walls of the TGVs 126, the platform 130 barely scatters light.

As stated, regarding the embodiments herein, light-scattering is in most cases something to avoid. Further, surface roughening affects light scattering. However, the embodiments herein have found ways to minimize surface roughening and separately also minimize light scattering. If light is not scattered, the platform 130 remains optically transparent. This feature is advantageous for usages and activities such as positioning a sample, loading biological cells in the TGVs 126, and investigating biological cells.

Figure 5B:
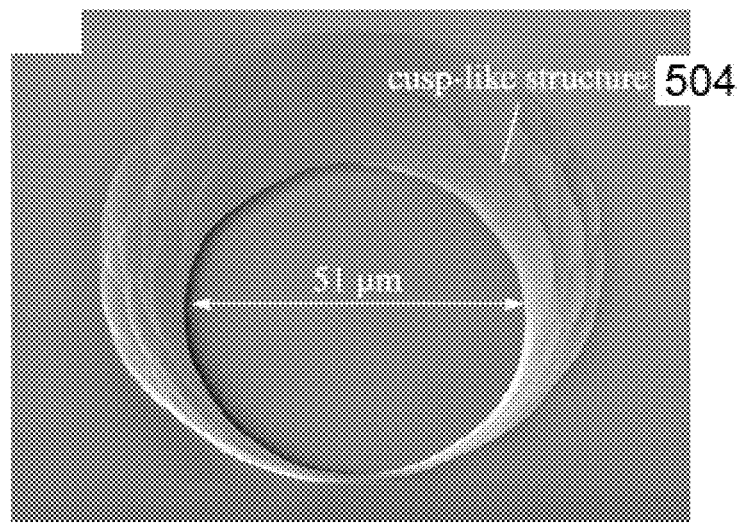
FIG. 5B is an SEM image of a center TGV taken on the etching side of the substrate under a tilt of 25°, including exemplary cusp-like structures developed on the walls of the TGV.

FIG. 5B is an SEM image of the center TGV, taken on the etching side under a tilt of 25°. The wall of the TGV is clearly rougher than the rest of the NCD-glass platform.

FIG. 1G shows a micrograph taken on the growth side 116, where the circular shape represents the suspended portion of the NCD film. From FIG. 5B it is apparent that the wall of the TGV is clearly rougher than the rest of the structure. All TGVs are tapered from the etching side towards the growth side and have minimum and maximum diameters of approximately 50 μm and 80 μm, respectively. Since the diameter of the suspended NCD film 124 is approximately 60 μm, the NCD film 124 is underetched by approximately 5 μm.

Figure 5C:
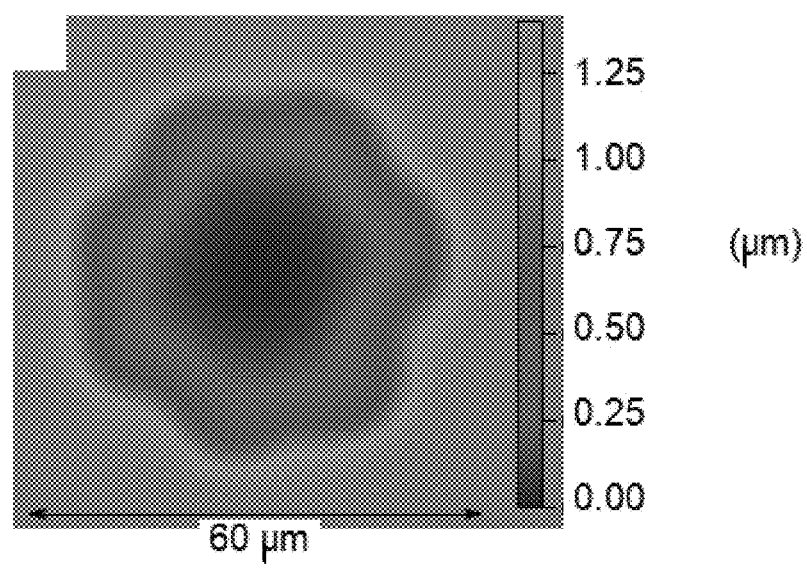
FIG. 5C depicts the surface profile of a portion of the NCD film that seals the central TGV.

FIG. 5C shows a surface profile of a portion of the NCD film 124 that seals the central TGV 126, where the profile is taken on the growth side and the suspended portion of the NCD film 124 is slightly buckled towards the glass substrate 108 with a maximum deflection of approximately 1.25 μm. This behavior is seen for all suspended portions of the NCD film 124 used for sealing TGVs 126, as is discussed in more detail below.

To show that the bond between the NCD film 124 and the glass substrate 108 is sufficiently strong for practical use, a gauge pressure of 300 kPa can be applied to the suspended NCD layer 124 on the etching side 112. Through experimentation and testing, the result was found to be that the structure of the NCD-glass platform 130 withstands such pressures.

After laser ablation in step 2, the blind holes 120 can be photographed and optimally, no cracks in the blind holes 120 will be observed. However, as shown in FIG. 5B, cusp-like structures 504 can develop on the walls of a TGV 126 during the laser ablation process. Cusps 504 may be useful for cells to attach onto, but also act to scatter light and thus make the platform 130 less transparent, which is unwanted. The cusp structures 504 typically develop from cracks during an etching process. FIG. 5B at least suggests that any cracks during the laser ablation process were too small to be detected by the SEM imaging techniques discussed herein, which is advantageous.

Further, due to the optimization of the laser ablation processes discussed herein, a feature size allowing the TGVs to be fairly circular was achieved. Using an excimer laser for laser ablation or activating the glass with a laser instead of performing laser ablation will further reduce the roughness of the TGVs after etching.

NCD films, grown on fused silica substrates during step 3, became completely delaminated during step 4. This is likely caused by tensile stress, which is to be expected since the coefficient of thermal expansion of fused silica is less than that of diamond over the entire range of operating temperatures used during preliminary experiments.

As part of the process of etching the glass substrate 108 with HF in step 4, the NCD film gets suspended. The NCD film 124 acts as a etch stop for HF. The suspended NCD film 124 seals the TGVs 126. The embodiments herein are advantageous in that they can fabricate TGVs 126 that are sealed with a thin film.

NCD films grown on substrates made of any glass listed in Table 1, except fused silica, are compressively stressed, which suggests that the coefficients of thermal expansion of those types of glass might be greater than that of diamond for significant portions of the temperature ranges used in the relevant growth processes.

It is sometimes necessary to make alterations to films used in masking parts of glass substrates during HF etching. In making these alterations, compressive stress is preferable over tensile stress. A typical consequence of compressive stress is buckling, which is illustrated by FIG. 5C. For several applications, buckling is minimized by properly tuning the coefficients of thermal expansion of the film and the substrate. This is achievable since it is known that the coefficient of thermal expansion of diamond exceeds that of fused silica, but is less than many other glass substrates.

Method of Testing, Verifying, and Affirming Performance

What follows is one exemplary embodiment of photographing and verifying that the embodiments herein produce the desired advantageous results.

During manufacture and use of the embodiments herein, various images of portions of an NCD film that seals the TGVs were taken with a reflecting light microscope with the objective on the growth side of the glass substrate on which the NCD film is grown. A circular shape represents a suspended portion of the 175 nm thick NCD film. Such circular shapes are observable due to a difference between the refractive index of air and glass. These circular images are useful for affirming that the embodiments herein consistently produce structures of similar shape, and affirming that all equipment is properly connected and working together.

To further support these principles, reflecting microscope images of portions of the NCD film that seal the TGVs are also taken on the growth side of the glass substrate. Circular shapes can potentially represent the suspended portions of structures described herein.

Specifically, surface profiles of the portions of the NCD film are taken on the growth side of the glass substrate and all suspended portions of the NCD film are slightly buckled towards the glass substrate with maximum deflections of approximately 1.25 µm. Meanwhile, images surface profiles of portions of the NCD film can also be photographed on a/the growth side of the glass substrate.

FIGS. 7A-7B are scaled Raman spectra of a 3×3×0.3 mm$^3$ single crystal diamond and of the NCD film 124 shown in FIG. 4B. In each of these spectra, the most intense feature forms a peak that originates from the first-order Raman line of diamond, which is expected at the approximate Raman shift 1332/cm.

FIG. 7C shows a zoom-in of the peaks of FIGS. 7A-B. A center of the diamond peak extracted from the NCD film is positioned at a shift of approximate value 1334/cm, indicating that the film is strained due to a compressive stress of ~0.5 GPa acting on the film. The compressive stress is caused mainly by a thermal mismatch between NCD and the glass substrate 108 since a portion of unstrained freestanding film generates a diamond peak XXX approximately at 1332/cm. The large band located at shifts larger than 1332/cm and the large photoluminescence background observed in FIG. 7B are mainly ascribed to sp$^2$ carbon and hydrogen that are present in the NCD film, respectively. As stated, within this disclosure, the expression to "sp$^2$ carbon" will be understood to mean hybridized carbon arranged in a way that is different than how carbon is arranged within e.g. diamond.

The presence of impurities as well as point and line defects are also a known factor for the broadening of a diamond peak, which explains the considerably wider peak 704 obtained for the NCD 124 compared to the peak 708 obtained for single crystal diamond. Finally, it is noteworthy that the analysis demonstrated within FIGS. 7A-7C is consistent with the X-ray diffraction studies discussed elsewhere within this disclosure.

While preferred embodiments of the present invention have been shown and described herein, it will be obvious to those skilled in the art that such embodiments are provided by way of example only. It is not intended that the invention be limited by the specific examples provided within the specification. While the invention has been described with reference to the aforementioned specification, the descriptions and illustrations of the embodiments herein are not meant to be construed in a limiting sense. Numerous variations, changes, and substitutions will now occur to those skilled in the art without departing from the invention. Furthermore, it shall be understood that all aspects of the invention are not limited to the specific depictions, configurations, or relative proportions set forth herein which depend upon a variety of conditions and variables. It should be understood that various alternatives to the embodiments of the invention described herein may be employed in practicing the invention. It is therefore contemplated that the invention shall also cover any such alternatives, modifications, variations, or equivalents. It is intended that the following claims define the scope of the invention and that methods and structures within the scope of these claims and their equivalents be covered thereby.

The invention claimed is:

1. A method of fabricating a through glass via on a suspended nanocrystalline diamond, comprising:
    configuring a glass substrate to have an etching side and a growth side;
    locally etching the glass substrate on the etching side;
    performing the local etching until achieving a predetermined substrate thickness;
    creating a plurality of blind holes of a predetermined diameter and predetermined depth into the glass substrate by laser ablation or modifying the glass substrate with laser light;
    growing a nanocrystalline diamond film of predetermined film thickness on the growth side; and
    performing additional etching; thereby forming a plurality of sealed through glass vias within the glass substrate.

2. The method of claim 1, further comprising:
    performing the local etching using a solution having a first predetermined amount of HF.

3. The method of claim 2, further comprising:
    performing the additional etching using a solution having a second predetermined amount of HF.

4. The method of claim 3, further comprising:
    the first predetermined amount of HF being larger than the second predetermined amount of HF.

5. The method of claim 4, further comprising:
    the second predetermined amount of HF causing the glass substrate to have a predetermined surface roughness.

6. The method of claim 3, further comprising:
    the concentration of the solution having the second predetermined amount of HF is lower than the concentration of the solution having the first predetermined among of HF; and
    the use of the solution having the second predetermined amount of HF creating a slower etch rate and therefore achieving a finer control over a depth of the etch, than when the solution having the first predetermined amount of HF is used.

7. The method of claim 3, the step of laser ablating further comprising:
    laser ablating the blind holes at a predetermined power.

8. The method of claim 2, further comprising:
achieving a specific predetermined thickness of the glass substrate within a neighborhood of the through glass vias.
9. The method of claim 1, further comprising:
retaining one or more non-etched portions of the glass substrate; and
the retained non-etched portions serving as a supporting frame for the etched portion.
10. The method of claim 1, further comprising:
performing the locally etching at a predetermined temperature and humidity, and
performing the additional etching at the predetermined temperature and humidity.
11. The method of claim 1, further comprising:
performing the local etching within a predetermined time period.
12. The method of claim 1, further comprising:
performing the additional etching within a predetermined time period.
13. The method of claim 1, further comprising:
during the step of growing the nanocrystalline diamond film, preventing the etching side from having any direct contact with a cooled substrate holder.
14. The method of claim 1,
wherein said plurality of blind holes of said predetermined diameter and said predetermined depth are created by laser ablation.

* * * * *